United States Patent [19]

Cook et al.

[11] 4,199,695
[45] Apr. 22, 1980

[54] AVOIDANCE OF HOT ELECTRON OPERATION OF VOLTAGE STRESSED BOOTSTRAP DRIVERS

[75] Inventors: Peter W. Cook, Mount Kisco; Stanley E. Schuster, Granite Springs, both of N.Y.

[73] Assignee: International Business Machines Corporation, Armonk, N.Y.

[21] Appl. No.: 883,429

[22] Filed: Mar. 3, 1978

[51] Int. Cl.$^2$ .......................................... H03K 3/353
[52] U.S. Cl. ................................ 307/269; 307/262; 307/223 C; 307/304
[58] Field of Search ............... 307/223 C, 224 C, 262, 307/269, 279, 304, 237, DIG. 4

[56] References Cited

U.S. PATENT DOCUMENTS

| | | | |
|---|---|---|---|
| 3,927,334 | 12/1975 | Callahan | 307/DIG. 4 |
| 4,061,933 | 12/1977 | Schroeder et al. | 307/262 |

OTHER PUBLICATIONS

W. J. Craig et al., "Field-Effect Transistor Driver Circuit", IBM Technical Disclosure Bulletin, vol. 17, No. 12, May 1975, pp. 3531-3532.
J. C. Cassani et al., "Single Input Driver Circuit", IBM Technical Disclosure Bulletin, vol. 18, No. 6, Nov. 1975, p. 1765.

*Primary Examiner*—John Zazworsky
*Attorney, Agent, or Firm*—Pollock, Vande Sande & Priddy

[57] ABSTRACT

An improved field effect transistor circuit adapted to operate at high switching speeds and to avoid hot electron operation of voltage stressed FET bootstrap drivers. The circuit comprises a voltage control means adapted to maintain a simultaneous gate and drain to source voltage of FET devices within a characteristic hot electron operational voltage range. The voltage control means is adapted to reduce FET drain to source voltage by connecting a plurality of FET devices in series to reduce the drain to source voltage drop across each device. The drain to source voltage is further defined by connecting the common nodes of successive series connected devices to a specified voltage source that is less than a characteristic hot electron drain to source voltage. The voltage control means also includes a gate voltage clamping FET that is adapted to hold down the gate of a device when the drain to source voltage of the device rises above a particular hot electron voltage. The voltage control means further comprises a plurality of timing pulses that define particular combinations of gate and drain to source device voltages that are less than characteristic combined hot electron voltages. The voltage control means further includes devices with width to length ratios adapted to provide close voltage tracking between input drain voltages and output source voltages to maintain a minimum drain to source voltage drop. The operation of the hot electron voltage control means is particularly described with respect to embodiments using voltage stressed bootstrap driver FETs to generate on chip clock phases.

23 Claims, 7 Drawing Figures

AVOIDANCE OF HOT ELECTRON OPERATION OF VOLTAGE STRESSED BOOTSTRAP DRIVERS

BACKGROUND OF THE INVENTION

The invention relates to high voltage field effect transistor bootstrap driver circuitry and, more particularly, to such circuitry including means to avoid hot electron operation of the devices in the circuit.

FET bootstrap drivers are useful in high voltage switching applications for the reason that capacitive coupling between the drain and gate of a driver allows the gate voltage of the driver to rise with the signal input at the drain. The close tracking of the gate and drain allows the driver to generate a source signal that closely tracks the voltage signal at the drain. Thus, the bootstrap driver FET is particularly well adapted to transmit high voltage signals and to thereby drive relatively heavy loads, such as from 25 to 50 picofarads, at signal rise times approaching 1 nanosecond.

The high voltage signal transmission capacity of a bootstrap driver is necessarily dependent upon the relative physical dimensions of the channel of the driver device. The relative dimensions of this channel are expressed as a width to length ratio that is essentially an indication of the relative current carrying capability of the driver. Increasing width to length ratios indicate a proportionately increasing FET driver current carrying capability. Thus, reduced channel lengths are necessary for rapid switching of heavy driver loads.

However, reduced channel lengths and elevated operational voltages result in appreciable emission of hot electrons from the silicon substrate of a FET into the gate silicon dioxide layer. The trapping of the emitted hot electrons in the gate insulator layer can result in threshold shift or transconductance degradation of the FET, as indicated in, T. H. Ning, C. M. Osburn, and H. N. Yu, "Effect of Electron Trapping on IGFET Characteristics," J. Electron. Materials, Vol. 6, March, 1977, pages 65–76.

Thus, due to the problem of hot electron degradation at elevated gate and drain to source voltages, prior art bootstrap driver circuits have been limited to relatively low operational FET voltages.

In particular, on chip bootstrap driver clock phase generation circuits have been limited to relatively low operational voltages and, therefore, have not been able to drive heavy electrical loads at high switching speeds.

Accordingly, it is an object of the invention to provide a means to operate FET bootstrap drivers at elevated operational voltages for high-load fast-switching applications and to avoid hot electron degradation of the drivers.

A further object of the invention is to provide a simple and effective high speed on chip clock phase generator adapted to receive a lightly loaded off chip clock input and to drive large on chip loads at rise times comparable to the rise time of the off chip clock.

Another object of the invention is to provide an on chip clock phase generator adapted to minimize constant DC power dissipation.

These and other objects of the invention will become apparent from a review of the detailed specification which follows and a consideration of the accompanying drawings.

BRIEF SUMMARY OF THE INVENTION

In order to achieve the objects of the invention and to overcome the problems of the prior art, the bootstrap driver circuit, according to the present invention, includes voltage control means adapted to limit the simultaneous gate and drain to source dynamic operational voltages of devices to maintain the voltages within a characteristic hot electron operational range. The hot electron avoidance apparatus of the invention is described with respect to embodiments of a clock phase generator. The clock generator circuit, in accordance with the invention, is able to provide relatively high voltage clock outputs while keeping individual FET devices within hot electron operational limits.

The invention utilizes series coupled devices to distribute unusually high voltages at particular circuit nodes. The voltage distribution is adapted to place a safe operational voltage across the drain and source of each of the series connected devices. In addition, the invention provides a means to connect shared nodes of successive series coupled devices to a specified voltage source to further define a safe operational drain to source voltage for the coupled devices.

The invention also provides for clamping the gates of voltage stressed devices to ground in order to resist the injection of hot electrons into the oxide layer of the device. A combination of gate clamping and series coupling to provide safe FET operation is also illustrated.

The apparatus of the invention also avoids hot electron operation by employing timed clock pulses to separately control the gate voltage and drain to source voltage of a FET device. More particularly, a first electrical pulse is used to define the source to drain voltage of a FET and a second inverted pulse with a trailing edge delay is used to define the gate voltage of the FET. The leading edge of the inverted pulse is adapted to ground the gate of the FET during the time that the drain to source voltage is high or rising and the delayed trailing edge of the inverted pulse is adapted to apply a positive voltage to the gate after the drain to source voltage has dropped to an appropriate level.

In addition to the above hot electron avoidance means, the circuit of the invention employs bootstrap driver devices with width to length ratios that are large enough to insure that the source voltage of the device closely tracks the drain voltage. Thus, the source to drain voltage drop across the device is minimized and hot electron operation is avoided.

The clock phase generator embodiments of the invention avoid hot electron deterioration of component FETs and particularly illustrate a means to chain together a series of identical bootstrap driver circuit stages that are adapted to receive either a single off chip clock or a dual, shifted phase off chip clock to generate on chip clock phases.

Each of the series coupled bootstrap driver circuit stages is adapted to receive an input clock and, if enabled, to transmit the clock pulse to generate an on chip clock phase. In operation, a first stage transmits an initial clock phase and each successive stage transmits its associated clock phase in a sequential timed relation.

Upon transmitting a particular clock phase, a circuit stage is adapted to enable the next succeeding stage and to disable its preceding enabling stage. Since the series coupled stages form a closed signal transmission loop, once started, the enable-disable operation of each stage continuously and sequentially propagates around the loop and a continuous stream of clock phases is thereby generated in a timed relation.

DETAILED DESCRIPTION OF PREFERRED EMBODIMENTS

Figure 1:
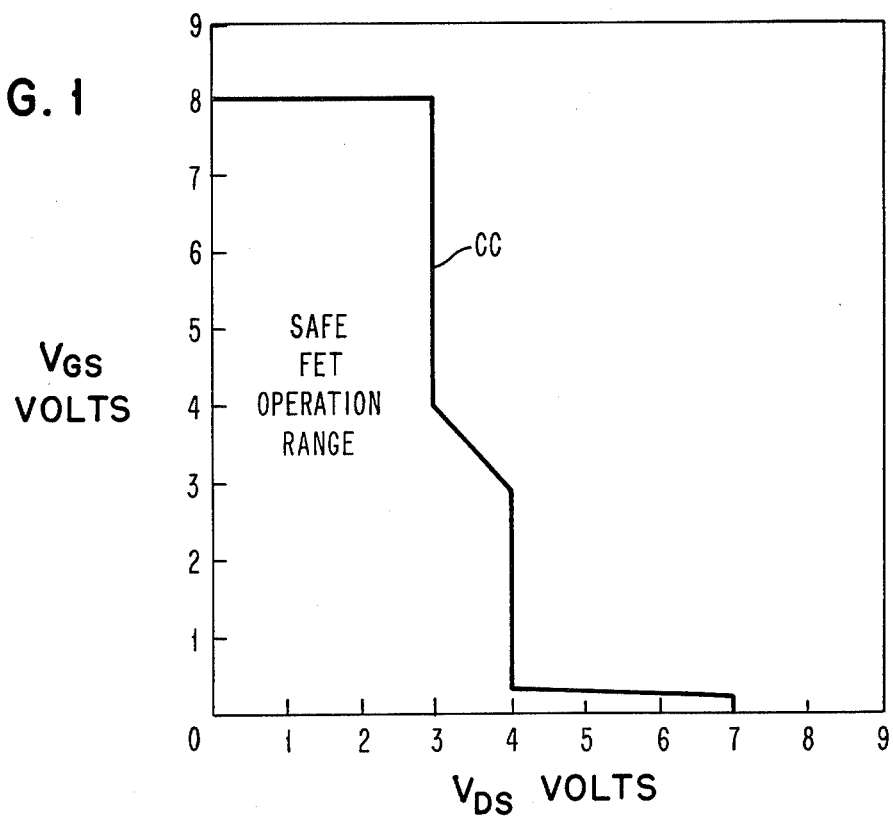
FIG. 1 shows a typical plot of hot electron operational voltage limits for a particular field effect transistor.

The remaining portion of this specification will describe preferred embodiments of the invention when read in conjunction with the attached drawings, in which like reference characters identify identical apparatus.

FIG. 1 illustrates a typical plot of hot electron voltage operational limits for a particular FET device. The curve cc defines the operational voltage limits of the device. If the simultaneous gate and drain to source voltage of a particular device fall outside of the curve cc, that device will be operating in the hot electron region and damage or deterioration of the device may result. However, if the simultaneous operational voltages of the device fall within the curve cc, the device will be operating within its hot electron limits and will, therefore, not be damaged by hot electron effects.

Figure 2:
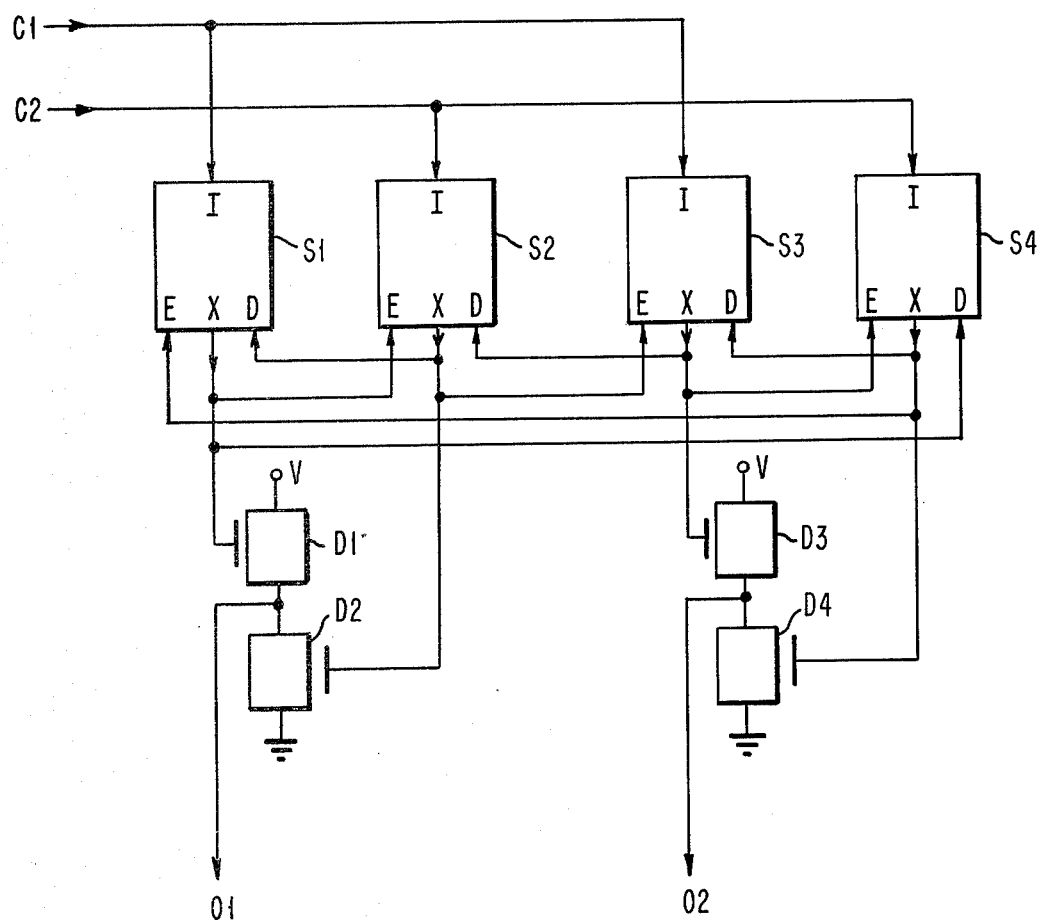
FIG. 2 illustrates a block diagram of a two-phase clock generator with dual shifted phase clock inputs.

FIG. 2 illustrates an apparatus of the invention that is adapted to receive two lightly loaded nonoverlapping off chip clocks, C1 and C2, and to generate two high voltage on chip clock phases 01 and 02.

Figure 3:
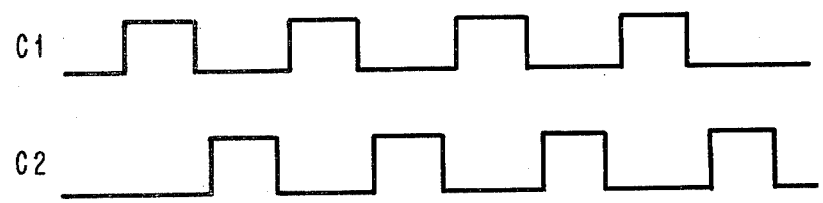
FIG. 3 is a timing diagram of the input clock pulses C1 and C2 and FIG. 2.

The relationship of the clocks C1 and C2 is illustrated in the timing diagram of FIG. 3. As shown in the diagram, clocks C1 and C2 are of the same frequency and are shifted in phase with respect to one another so that the clock pulses of C2 alternate with the clock pulses of C1.

Each of the stages S1–S4 of FIG. 2 represents a bootstrap driver FET circuit stage that is adapted to receive an input off chip clock pulse at an input I and to pass the clock pulse to an output X if the stage has been enabled.

A stage is enabled by a high input pulse at an enable input E, and remains enabled to pass an input clock pulse until it is disabled by the application of a high input pulse on a disable input D.

As will become apparent from an examination of FIG. 2, the stages S1–S4 are coupled in series and form a closed signal transmission loop. More particularly, the output X of each stage is connected to the disable input D of the preceding stage and to the enable input E of the succeeding stage.

In operation, stage S1 is initially enabled and all of the remaining gating circuits are disabled. Thus, stage S1 initially passes a pulse from its clock input C1 to its output X and the output X of S1 enables the next succeeding stage S2 and disables the preceding stage S4. The enabled stage S2 then receives a clock pulse from the clock input C2 and passes the pulse to its output X. The output X of S2 is applied to the disable input D of the preceding stage S1 and thereby disables S1. The output X of S2 is also applied to the enable input E of the next succeeding stage S3 and enables S3 to pass the next pulse from the clock input C1. Of course, the disabled stage S1 is not able to pass the C1 pulse. The enabled stage S3 passes the C1 pulse to its output X and thereby enables the succeeding stage S4 and disables the preceding stage S2. The enabled stage S4 then passes the next C2 pulse to its output X and, likewise, enables S1 and disables S3.

The above-described pattern of enables and disables propagates from stage to stage in a closed transmission loop.

In addition to enabling succeeding stages and disabling preceding stages, the output X of each stage is applied to a phase output driver for generating an output phase signal. Specifically, the output X of the stage S1 is applied to the gate of an output device D1 to turn on the device D1 and thereby apply a positive voltage at a phase output O1. The phase output O1 remains positive until the output X of the next succeeding stage S2 is pulsed to turn on an output device D2 to ground the phase output O1. Thus it is apparent that the output x of S1 defines a leading edge of the phase output O1 and the output X of S2 defines a trailing edge of the phase output O1. In a similar manner, the output X of the stage S3 is applied to the gate of an output device D3 to define a leading edge of a phase output O2, and the output X of the stage S4 is applied to a gate of a device D4 to define a trailing edge of the phase output O2.

Thus, in accordance with the above operational description, the two-phase clock of FIG. 2 alternately generates a continuous stream of clock phase outputs O1 and O2. It is readily apparent that any number of phases can be produced from the above-described scheme by adding additional pairs of stage gating circuits and associated phase output devices.

Figure 4:
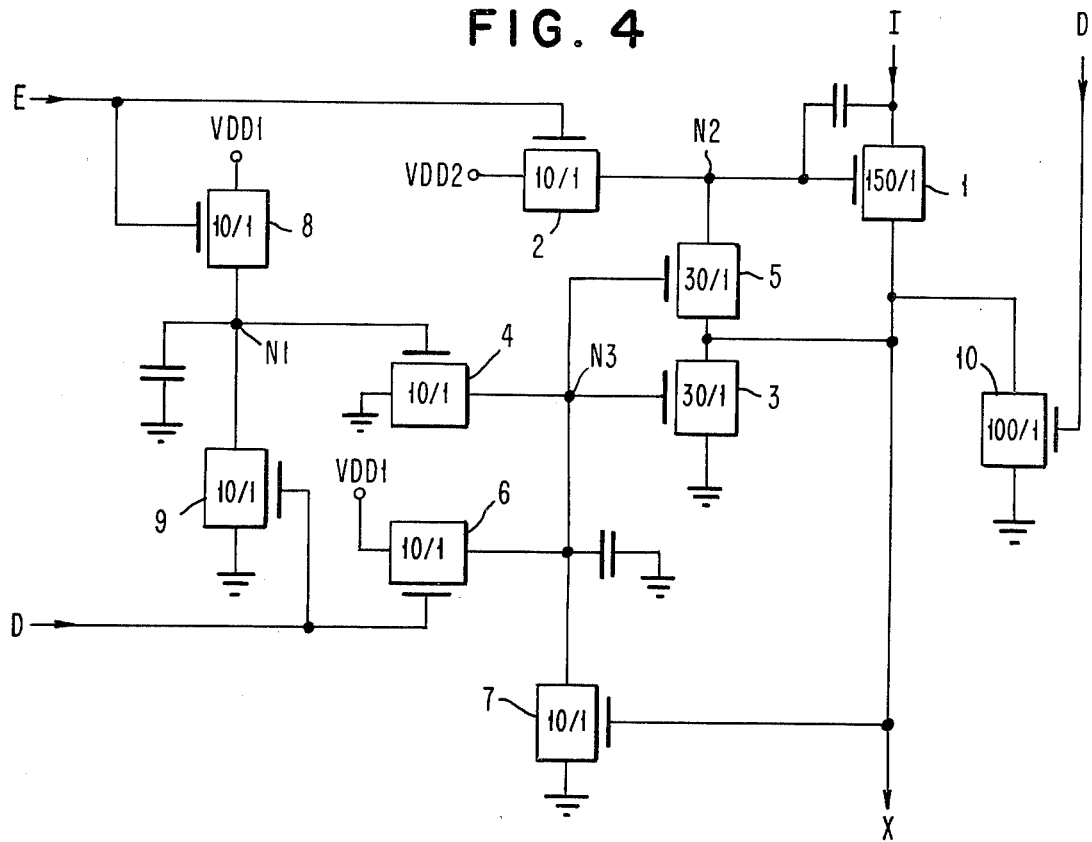
FIG. 4 illustrates a bootstrap driver circuit for a stage of the two-phase dual input clock generator of FIG. 2.

FIG. 4 illustrates a bootstrap driver circuit that corresponds to one of the stages of FIG. 2. In the circuit, FET devices are represented by rectangular symbols and the gate of a particular device is indicated by a spaced line. A particular suggested width to length ratio for each device is indicated inside of each rectangular symbol. In operation, a high pulse on an enable input E turns on devices 8 and 2. The turning on of the device 8 causes a node N1 to charge to a positive voltage approximating VDD1, and the turning on of the device 2 causes a node N2 to charge to a voltage approximating VDD2. The high voltage at the node N1 is applied to the gate of a device 4 turning on device 4 and thereby discharging a node N3 to ground. The nodes N2 and N1 remain high after the enable pulse has passed and, due to device 4, the node N3 is held at ground.

When a clock input pulse appears at I, the drain of a bootstrap driver device 1 begins to rise to a positive voltage and additional voltage is thereby capacitively coupled to the node N2 from the drain of the device 1. The source output of the bootstrap drive device 1 closely follows its rising drain input and, as the source rises to a positive voltage, a device 7 is turned on, thereby further clamping the node N3 to ground. Of course, the input clock pulse at I is transmitted through the bootstrap driver device 1 to the output X of the stage.

Following the transmission of the output pulse X, the next succeeding stage generates a disable pulse D that is applied to the gate of the device 6 and the gate of a device 9. The device 6 is turned on, thereby causing the node N3 to charge to a positive voltage VDD1 and the device 9 is turned on to ground the Node 1. The disable pulse D also turns on a device 10 that thereafter discharges the source output of the bootstrap driver device 1 to ground.

The circuit of FIG. 4 avoids hot electron effects by operating the devices 3 and 5 in accordance with the invention. More particularly, when the input pulse I is transmitted by the bootstrap driver device 1, the node N2 charges to a voltage that approximates VDD2 plus the capacitively coupled voltage of the pulse at I. This high voltage at the node N2 would normally be sufficient to force a single device with a floating gate outside of the hot electron curve Cc of FIG. 1. However, the series coupling of the devices 3 and 5 distributes the high voltage of the node N2 and thereby provides for decreased drain to source voltages across the devices 3 and 5.

In addition, a common node between the devices 3 and 5 is tied to the source of the bootstrap driver device 1 so that the positive voltage at the source of the device 1 defines a voltage at the common node of 3 and 5.

Furthermore, the positive voltage at the source of the boot-strap driver device 1 turns on the device 7 and causes the node N3 to be clamped to ground. The grounding of the node N3 grounds the gate inputs of the devices 3 and 5 and thereby ensures that the devices 3 and 5 operate well within the hot electron region. Thus, the high voltage at the node N2 is distributed over the devices 3 and 5, the node between the devices 3 and 5 is tied to the output X, thus dividing the voltage at N2 between devices 3 and 5 in a well defined and controlled way, and the gates of the devices 3 and 5 are grounded to further insure operation within the hot electron region.

Although the above hot electron avoidance circuit is described with respect to an on chip clock generator, it is apparent that such circuitry could be used in any bootstrap drive FET circuit in which maximum voltage operation is required. In addition, it is noted that the particular width to length ratios that are specified for each of the FETs of the circuit of FIG. 4 are provided for illustrative purposes and are not necessarily required to make the circuit operate in accordance with the invention.

Figure 5:
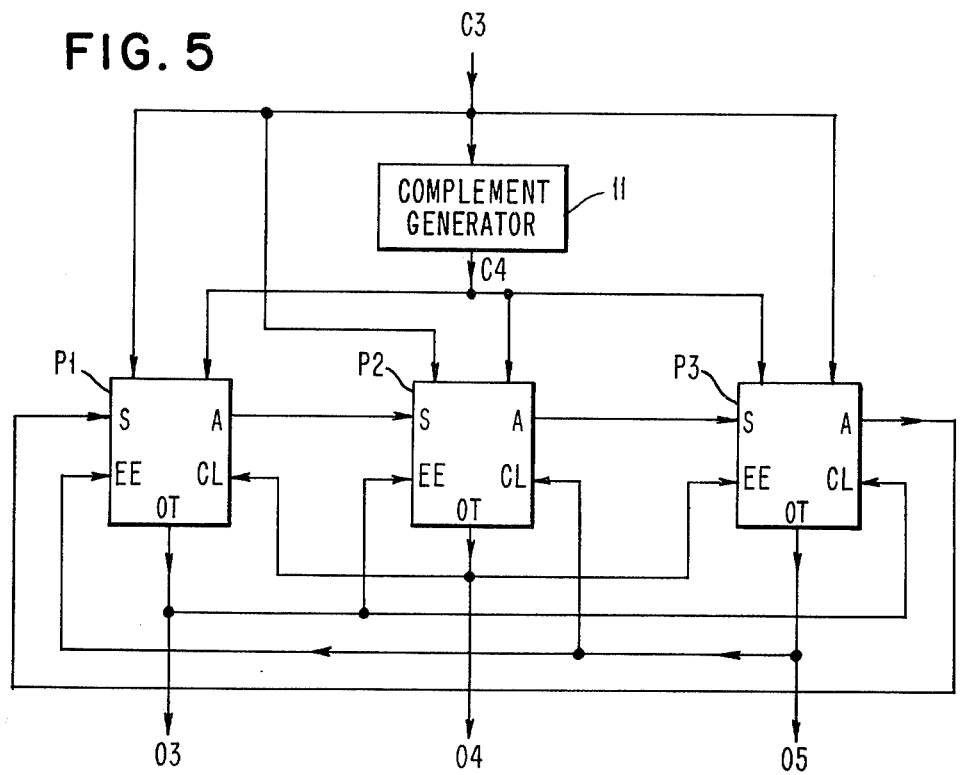
FIG. 5 illustrates a block diagram of a three-phase clock generator with a single clock input.

FIG. 5 illustrates a clock phase generating apparatus of the invention that is adapted to receive pulses C3 from a single lightly loaded off chip clock and to generate three high voltage on chip clock phases O3, O4, and O5. More particularly, a complement pulse generator 11 is adapted to receive input pulses C3 from the off chip clock and to generate inverted pulses C4 with a trailing edge delay. The inverted pulses C4 and the input pulses C3 are applied at the input of phase stages P1, P2, and P3 and the stages thereafter generate respective output clock phases in a continuous sequential timed relation.

Figure 6:
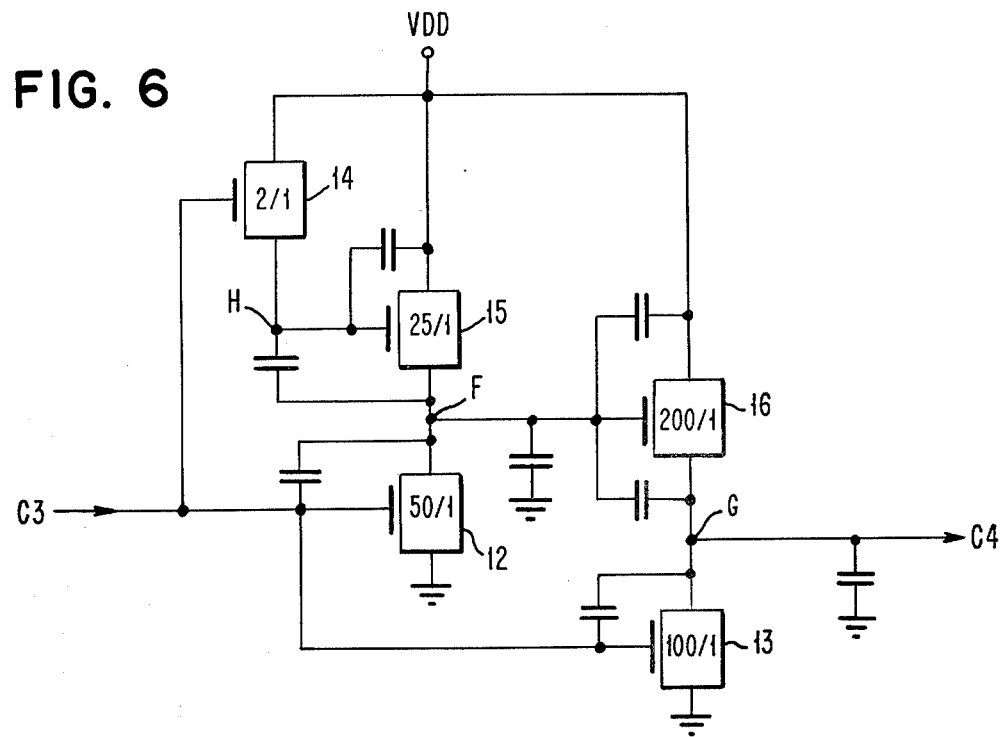
FIG. 6 illustrates a driver circuit for the complement generator of FIG. 5.

FIG. 6 illustrates a particular FET circuit for receiving an input pulse C3 and generating an inverted pulse C4 with a delayed trailing edge C4. As shown in FIG. 6, the input clock pulse C3 is applied to the gate of a device 12 to turn on the device and thereby discharge a node F to ground. The pulse C3 also turns on a device 13 and thereby causes the C4 signal at an output pin G to go low. Thus, the rising edge of the input pulse C3 rapidly generates a corresponding falling edge of the inverted pulse C4.

The rising C3 input pulse also turns on a device 14, causing a node H to charge to Vdd. The positive voltage at the node H serves to turn on a device 15 causing the device 15 to attempt to charge the node F. However, since the device 12 is turned on and has a greater width to length ratio than the device 15, the device 12 will be able to sink more current than the device 15 can pass. Thus, for as long as the device 12 is turned on by the positive input pulse C3, the node F remains held close to ground.

When the voltage of the C3 input pulse drops, the devices 12 and 13 are turned off but the device 15 remains on due to the positive voltage at the node H, thereby causing the node F to begin charging. When the voltage at the node F has charged sufficiently, a device 16 is turned on and the inverted signal C4 at the output pin G rises. Thus, as can be understood from the above discussion, the delayed charging of the node F by the device 15 after the input pulse C3 drops, results in a delay of the rising edge of the inverted pulse C4.

As explained above, the inverted pulse C4 and the input pulse C3 are applied to the input of the phase stages P1–P3 to generate a continuous stream of three-phase clock signals. Each of the phase stages P1–P3 of FIG. 5 represents a bootstrap driver FET circuit that is adapted to receive the clock pulses C3 and C4 and generate an output phase pulse OT if the stage has been enabled and activated.

As will become apparent from an examination of FIG. 5, the stages P1–P3 are coupled in series and form a closed signal transmission loop. More particularly, the output OT of a stage is connected to an enable input EE of a succeeding stage and is connected to a clear input CL of a preceding stage. In addition, an activate output A of a stage is connected to a start input S of a succeeding stage.

In operation, a stage is enabled by a high enable input pulse at its enable input EE. The enable pulse for a stage is generated by an output signal OT of a preceding stage. In addition, a stage is activated when a positive activate pulse A is applied at its start input S. The activate signal A is generated by the trailing edge of the output signal OT of the preceding stage. Thus, before a stage can generate an output phase pulse OT, the stage must first receive an enable pulse EE followed by an activate signal A.

After a particular stage has generated its associated output phase signal OT and has enabled and activated a next succeeding stage, it is disabled by the inverted clock C4; it is further adapted to receive a clear signal CL to clear its activate signal output hardware. The clear signal CL for a stage is generated by the output signal OT of the next succeeding stage.

Figure 7:
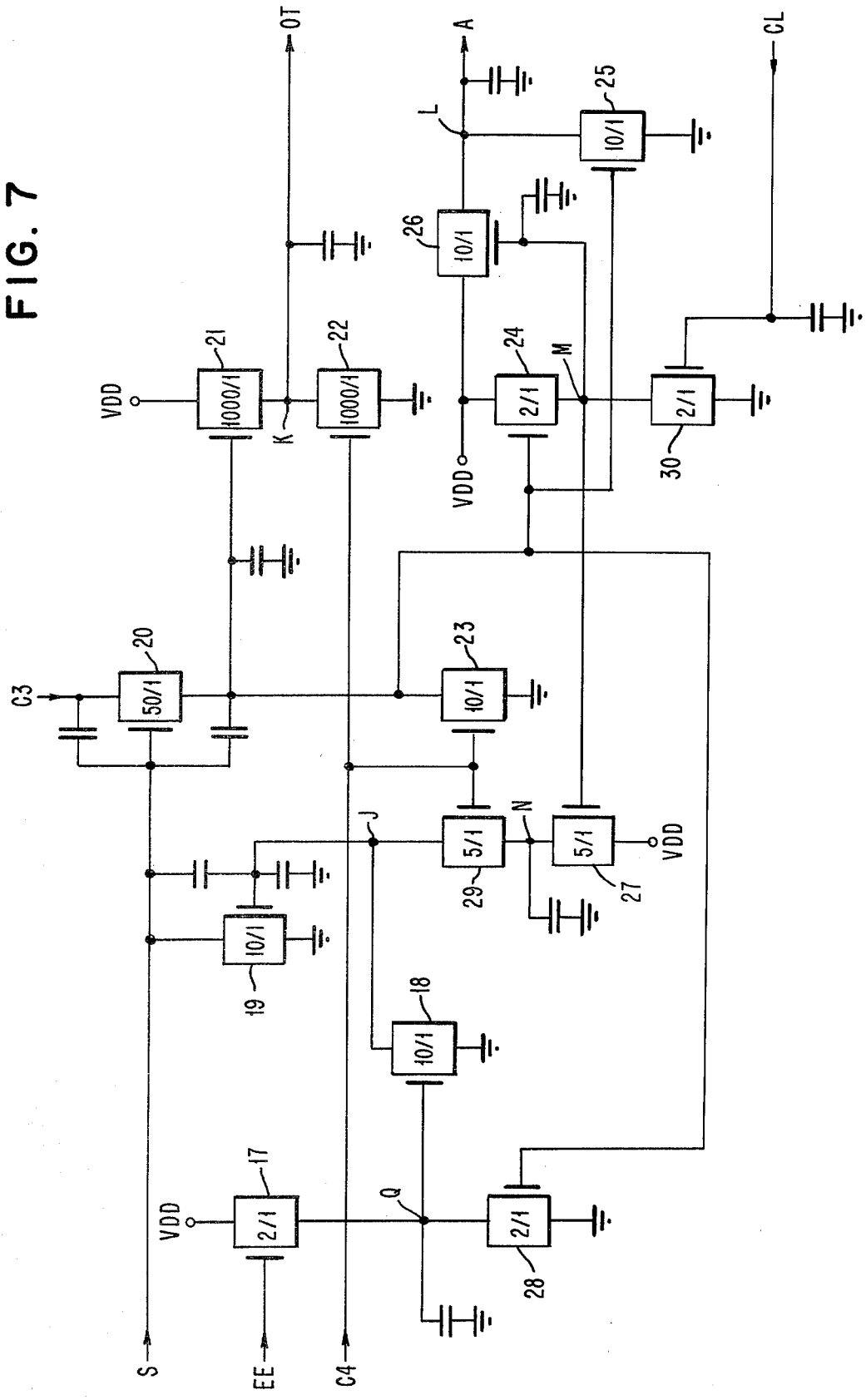
FIG. 7 illustrates a bootstrap driver circuit for a phase stage of the clock generator of FIG. 5.

The particular operation of a stage may be more clearly understood with reference to FIG. 7 which illustrates a bootstrap driver circuit that corresponds to one of the identical stages P1–P3 of FIG. 5. In operation, a positive enable pulse is initially applied to the EE input of the circuit of FIG. 7. The positive EE signal turns on a device 17 and thereby causes a node Q to charge to a positive voltage. It is noted that added capacitance at the node Q ensures that the node will remain charged after the signal EE returns to ground. The voltage at the node Q turns on a device 18 and thereby discharges a node J to ground. The ground at the node J turns off a device 19 and thereby readies the stage to receive an activate signal A at input S.

As indicated above, an EE signal is defined by the leading edge of an output phase pulse OT of a preceding stage and the activate signal A is defined by the trailing edge of the OT pulse. Therefore, a positive activate signal is received at the S input of the circuit of FIG. 7 at a specified time delay after the circuit receives the initial positive EE signal. It is noted that the use of delayed signals in this case maintains the operation of the device 19 within its hot electron limits since the gate of the device 19 is discharged to ground at the node J before a positive voltage appears at the drain of the device 19.

The positive activate signal A at the input S turns on an input bootstrap driver device 20 and thereby prepares the driver to transmit the next clock input pulse C3. The input pulse C3 is transmitted by the driver device 20 to turn on a device 21 and to thereby cause an output phase pulse OT and an associated node K to begin rising. It is noted that at this time the inverted pulse C4 is low due to the operation of the above-described devices 12 and 13 of the circuit of FIG. 6. Therefore, a device 22 and a device 23 are strongly turned off by the low inverted pulse C4 and are thereby prevented from operating outside of their respective hot electron limits since their respective gates are grounded when a rising voltage is applied to their drains. In addition, the device 21 is also protected from hot electron operation since the rapid turning off of the device 22 prevents a large voltage from developing across the drain to source of the device 21.

The input pulse C3 that is transmitted by the device 20 also turns on a device 24 and a device 25. The device 25 is turned on to pull down a node L to ground and the device 24 is turned on to charge a node M to VDD. The rising voltage at the node M turns on a device 26 and a device 27. It is noted that the turning on of the device 26 does not cause the node L to rise in voltage since the previously turned on device 25 continues to hold the node L at a low level. Also, the turning on of the device 27 causes a node N to charge to a positive voltage.

The positive input pulse C3 also turns on a device 28 and, since the enable pulse EE has passed, turns off the device 18 after a delay determined by the size of device 18 and the total capacitance at node Q. Since the node J is no longer strongly pulled to ground by the device 18, the node J and the associated gate of the device 19 is floating. However, the node J will remain at a low voltage because the node J and the associated gate of the device 19 were clamped to ground during the critical time when both the signals at S and at C3 were rising.

When the input pulse C3 is rising, the devices 20, 21, 12 and 13 do not exceed their respective hot electron limits due to the fact that the width to length ratios of the devices are high enough to allow the sources of the respective devices to charge quickly in comparison with the rising voltage at their respective drains. Thus, the drain to source voltage for each of the devices is minimized. It is noted, however, that although particular width to length ratios are specified for each of the above devices and for the other devices of FIGS. 6 and 7, the values are for illustrative purposes only and are not intended to limit the circuit to the particular values specified.

When the input clock pulse C3, drops, the devices 24 and 25 are turned off. Since the node M remains high, the device 26 remains turned on and, therefore, the turning off of the device 25 results in a charging of the node L. Since the node L corresponds to the activate A output of the stage circuit, it is obvious that the falling edge of the input clock pulse C3 has energized the activate output A of the circuit. As explained above, a high output pulse OT and a high activate pulse A from a stage circuit serves to enable and activate the next succeeding stage circuit. Therefore, since the node K and the associated output phase pulse OT of the present stage are high as explained above, and since the activate signal A has been generated, the present circuit has enabled and activated the next succeeding stage.

The falling input pulse C3 also turns off the device 21 and the device 28. The turning off of the device 28 puts the enable receiver devices 17, 18 and 28 in condition to receive a new enable pulse.

As indicated previously, the inverted pulse C4 has a rising edge delay. Therefore, even though the gate of device 21 has been turned off by the falling of the input pulse C3, the device 22 is not immediately turned on. Thus, the operation of the device 21 is maintained within the hot electron range since the device 22 is not turned on, and the source of the device 21 at the node K is not pulled down to ground until the device 21 is turned off. It is further noted that the delayed turning on of the device 22 pulls the node K to ground and thereby defines the falling edge of the output phase pulse OT.

The delayed rising edge of the inverted pulse C4 is also used to avoid turning on the device 23 while there is still a large drain to source voltage on the device. Thus, the falling input pulse C3 discharges the drain of the device 23 before the delayed rising edge of the inverted pulse C4 turns the device 23 on and the device 23 is thereby maintained within its hot electron limits.

It is also noted that the delayed rising edge of the inverted pulse C4 delays the turning on of a device 29 and the resultant charging of the node J and the associated gate of the device 19, until the signal S has dropped. That is, the turning on of the device 29 is delayed until after C3 has fallen and, the drain voltage of device 19 has dropped to an intermediate level by capacitive coupling to C3. Therefore, due to the above action of the delayed rising edge of the inverted pulse C4, the drain of the device 19 is pulled down before its gate is charged through the turned on device 29 and the device 19 is thereby operated within its hot electron limits. In addition, it is noted that when the device 19 is turned on by the charging at the node J, the gate of the device 20 is pulled to ground and further transmission of signals by the device 20 is prevented.

When the next succeeding stage generates its associated output phase pulse OT, it generates a positive signal at the clear input CL of the present circuit and turns on a device 30. The turning on of the device 30 discharges the voltage at the node M to ground and thereby turns off the device 26 and the device 27. The phase stage circuit is completely initialized and is ready to be enabled and activated to transmit a new clock input pulse C3.

Although a three phase embodiment of the phase generator was described above, it is apparent that any number of phases could be produced in accordance with the invention and the above description by merely adding additional series coupled stages.

The invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

What is claimed is:

1. An improved high speed clock phase generator of a type wherein a plurality of voltage stressed transistor devices are interconnected for receiving a first and second continuous stream of nonoverlapping clock pulses and generating a plurality of clock phase pulses repeated in a timed relation, said improved phase generator comprising:
a plurality of pairs of bootstrap driver stages connected in series in a closed transmission loop, each of said pairs including, a first stage having a plurality of interconnected transistor devices for receiving said first stream of clock pulses and defining the leading edge of a particular phase pulse in response to an associated enable condition and a second stage having a plurality of interconnected transistor devices for receiving said second stream of clock pulses and defining the trailing edge of said particular phase pulse in response to an associated enable condition;
means for sequentially enabling each of said bootstrap driver stages in said closed transmission loop;
means for connecting a plurality of the transistor devices of a bootstrap driver stage in series to reduce the drain to source voltage drop across each device; and
source means connected to a common point between adjacent series connected devices for generating a particular voltage and maintaining said common point at said particular voltage.

2. The improved phase generator of claim 1 wherein at least one of said transistor devices has a width to length ratio sufficiently large to provide close voltage tracking between its drain voltage and source voltage.

3. The improved phase generator of claim 1 wherein said means for sequentially enabling includes means for applying the phase pulse generated by each stage to enable a next succeeding stage and to disable a next preceeding stage.

4. An improved high speed clock phase generator of a type wherein a plurality of voltage stressed field effect transistor devices are interconnected for receiving a continuous stream of input clock pulses and generating a plurality of clock phases repeated in a timed relation, said improved phase generator comprising:
inverting means for receiving said continuous stream of input clock pulses and generating a corresponding continuous stream of inverted clock pulses, each with a trailing edge delay;
a plurality of bootstrap driver stages connected in series in a closed transmission loop, each stage having a plurality of interconnected transistor devices for receiving said inverted clock pulses and said input clock pulses and generating a corresponding clock phase pulse in response to an associated enable condition;
means for sequentially enabling each of said bootstrap driver stages in said closed transmission loop;
means for connecting a plurality of the transistor devices of a bootstrap driver stage in series to reduce the drain to source voltage drop across each device; and
source means connected to a common point between adjacent series connected devices for generating a particular voltage and maintaining said common point at said particular voltage.

5. The improved high speed clock phase generator of claim 4 wherein said means for sequentially enabling includes means for applying a leading edge portion and a trailing edge portion of the clock phase pulse generated by an enabled stage to enable a next succeeding stage and for applying the clock phase pulse generated by said next succeeding stage to disable said enabled stage.

6. The improved high speed clock phase generator of claim 4 wherein at least one of said transistor devices has a width to length ratio sufficiently large to provide close voltage tracking between its drain voltage and source voltage.

7. An improved circuit for maintaining the simultaneous values of drain to source and gate voltages of field effect transistor devices within a characteristic hot electron operational range, comprising:
means for connecting a plurality of said devices in series to reduce the drain to source voltage drop across each device; and
source means connected to a common point between adjacent series connected devices for generating a particular voltage and maintaining said common point at said particular voltage.

8. The improved circuit of claim 7 wherein at least one of said field effect transistor devices has a width to length ratio sufficiently large to provide close voltage tracking between its input drain voltage and output source voltage.

9. An improved circuit for maintaining the simultaneous value of drain to source and gate voltages of field effect transistor devices within a characteristic hot electron operational range, comprising:
source means for applying a particular value of drain to source voltage to at least one of said devices, the applied drain to source voltage defining a corresponding minimum gate voltage sufficient to cause said at least one device to operate outside of said characteristic hot electron operational range; and
gate control means for applying at the gate of said at least one device a voltage that is less than the minimum gate voltage.

10. The improved circuit of claim 9 wherein said gate control means includes means for clamping the gate of said at least one device to ground at least when said particular value of drain to source voltage is applied.

11. The improved circuit of claim 9 wherein said gate control means includes a field effect transistor for turning on to pull down the gate of said at least one device at least when said particular value of drain to source voltage is applied.

12. The improved circuit of claim 9 wherein said source means includes means for generating a first voltage pulse to define the drain to source voltage for said at least one device and said gate control means includes means for generating a second voltage pulse to define the gate voltage for said at least one device, said second pulse being applied to pull down the gate of said at least one device at least while the voltage of said first pulse is applied to the device.

13. The improved circuit of claim 9 wherein at least one of said field effect transistor devices has a width to length ratio sufficiently large to provide close voltage tracking between its drain voltage and source voltage.

14. An improved high speed clock phase generator of a type wherein a plurality of voltage stressed transistor devices are interconnected for receiving a first and second continuous stream of nonoverlapping clock pulses and generating a plurality of clock phase pulses repeated in a timed relation, said improved phase generator comprising:
- a plurality of pairs of bootstrap driver stages connected in series in a closed transmission loop, each of said pairs including, a first stage having a plurality of interconnected transistor devices for receiving said first stream of clock pulses and defining the leading edge of a particular phase pulse in response to an associated enable condition, and a second stage having a plurality of interconnected transistor devices for receiving said second stream of clock pulses and defining the trailing edge of said particular phase pulse in response to an associated enable condition,
- means for sequentially enabling each of said bootstrap driver stages in said closed transmission loop;
- source means for applying a particular value of drain to source voltage to at least one of said transistor devices, the particular value of voltage defining a corresponding minimum gate voltage sufficient to cause said at least one device to operate outside of a characteristic hot electron operational range; and
- gate control means for applying a voltage at the gate of said at least one device that is less than the minimum gate voltage to operate said at least one device within said hot electron range.

15. The improved phase generator of claim 14 wherein said means for sequentially enabling includes means for applying the phase pulse generated by each stage to enable a next succeeding stage and to disable a next preceeding stage.

16. The improved phase generator of claim 14 wherein said gate control means includes means for clamping the gate of said at least one device to ground at least when said particular value of drain to source voltage is applied.

17. The improved phase generator of claim 14 wherein said gate control means includes a field effect transistor for turning on to pull down the gate of said at least one device at least when said particular value of drain to source voltage is applied.

18. The improved phase generator of claim 14 wherein at least one of said transistor devices has a width to length ratio sufficiently large to provide close voltage tracking between its drain voltage and source voltage.

19. An improved high speed clock phase generator of a type wherein a plurality of voltage stressed field effect transistor devices are interconnected for receiving a continuous stream of input clock pulses and generating a plurality of clock phases repeated in a timed relation, said improved phase generator comprising:
- inverting means for receiving said continuous stream of input clock pulses and generating a corresponding continuous stream of inverted clock pulses, each with a trailing edge delay;
- a plurality of bootstrap driver stages connected in series in a closed transmission loop, each stage having a plurality of interconnected transistor devices for receiving said inverted clock pulses and said input clock pulses and generating a corresponding clock phase pulse in response to an associated enable condition;
- means for sequentially enabling each of said bootstrap driver stages in said closed transmission loop;
- source means for applying a particular value of drain to source voltage to at least one of said transistor devices for a bootstrap driver stage, the particular value of voltage defining a corresponding minimum gate voltage sufficient to cause said at least one device to operate outside of a characteristic hot electron operational range; and
- gate control means for applying a voltage at the gate of said at least one device that is less than the minimim gate voltages to operate said at least one device within said hot electron range.

20. The improved high speed clock phase generator of claim 19 wherein at least one of said transistor devices has a width to length ratio sufficiently large to provide close voltage tracking between its input drain voltage and output source voltage.

21. The improved high speed clock phase generator of claim 19 wherein said gate control means includes means for clamping the gate of said at least one device to ground at least when said particular value of drain to source voltage is applied.

22. The improved high speed phase generator of claim 19 wherein said gate control means includes a field effect transistor for turning on to pull down the gate of said at least one device at least when said particular value of drain to source voltage is applied.

23. The improved high speed clock phase generator of claim 19 wherein said source means includes means for applying at least one of said clock pulses to define the drain to source voltage for said at least one device; and
- said gate control means includes means for applying a corresponding inverted clock pulse to pull down the gate of said at least one device for at least as long as said clock pulse defines the drain to source voltage for said at least one device.

* * * * *

UNITED STATES PATENT AND TRADEMARK OFFICE
CERTIFICATE OF CORRECTION

PATENT NO. : 4,199,695
DATED : April 22, 1980
INVENTOR(S) : Cook et al

It is certified that error appears in the above-identified patent and that said Letters Patent are hereby corrected as shown below:

Col. 3, line 11, change "and Fig. 2" to --of Fig. 2--.

Col. 5, line 18, change "Cc" to --CC--.

Signed and Sealed this

First Day of July 1980

[SEAL]

Attest:

SIDNEY A. DIAMOND

Attesting Officer

Commissioner of Patents and Trademarks